(12) United States Patent
Sankaran

(10) Patent No.: US 6,876,317 B2
(45) Date of Patent: Apr. 5, 2005

(54) METHOD OF CONTEXT BASED ADAPTIVE BINARY ARITHMETIC DECODING WITH TWO PART SYMBOL DECODING

(75) Inventor: Jagadeesh Sankaran, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/858,140

(22) Filed: Jun. 1, 2004

(65) Prior Publication Data

US 2005/0001746 A1 Jan. 6, 2005

Related U.S. Application Data

(60) Provisional application No. 60/474,716, filed on May 30, 2003.

(51) Int. Cl.[7] .............................................. H03M 7/00
(52) U.S. Cl. .......................... 341/107; 341/50; 341/51; 714/794; 382/239; 382/232; 706/15; 706/16
(58) Field of Search .......................... 341/107, 50, 51; 706/15, 16; 382/239, 232

(56) References Cited

U.S. PATENT DOCUMENTS 6,560,368 B1 * 5/2003 Brown et al. ................ 341/107
6,633,856 B2 * 10/2003 Richardson et al. ........ 341/107
6,812,873 B1 * 11/2004 Siohan et al. ............... 341/107
6,825,782 B2 * 11/2004 Bossen ....................... 341/107

* cited by examiner

Primary Examiner—Michael Tokar
Assistant Examiner—Lam T. Mai
(74) Attorney, Agent, or Firm—Robert D. Marshall, Jr.; W. James Brady, III; Frederick J. Telecky, Jr.

(57) ABSTRACT

This invention is method of decoding a context based adaptive binary arithmetic encoded bit stream. The invention determines a maximum number of iterations for decoding a next symbol. This preferably employs a left most bit detect command. The invention considers the bit stream bit by bit until detection of a bit having a first digital state of the maximum number of iterations. If the maximum number of iterations occurs first, the invention decodes the considered bits. If a bit having the first digital state occurs first, the invention selects a number of next bits from the bit stream dependent upon the determined position within the coding table and decodes a symbol corresponding to the maximum number of bits and the selected number of next bits. The invention preferably pre-calculates an order symbol contexts corresponding to an order of determination of a code tree encompassing all possible codes and decodes symbols dependent upon a current context within the pre-calculated.

3 Claims, 1 Drawing Sheet

METHOD OF CONTEXT BASED ADAPTIVE BINARY ARITHMETIC DECODING WITH TWO PART SYMBOL DECODING

CLAIM OF PRIORITY

This application claims priority under 35 U.S.C. 119(e)(1) from U.S. Provisional Application No. 60/474,716 filed May 30, 2003.

TECHNICAL FIELD OF THE INVENTION

The technical field of this invention is data encoding using Context based Adaptive Binary Arithmetic Decoding (CABAC).

BACKGROUND OF THE INVENTION

Context based Adaptive Binary Arithmetic Encoding (CABAC) is a method of data compression. Decoding data compressed by this method is inherently serial by nature. This has made previous implementations of this method on a digital signal processor (DSP) very compute intensive compared to Huffman data compression algorithms. This computation intensity prevented the context based adaptive binary arithmetic data compression from being adopted for the early video coding standards proposed by the Motion Picture Expert Group (MPEG) such as MPEG-2 and MPEG-4. However the newer standards such as Joint Picture Expert Group (JPEG) JPEG 2000 for still pictures and H.264 for video conferencing use this method.

SUMMARY OF THE INVENTION

This invention is method of decoding a context based adaptive binary arithmetic encoded bit stream. The invention determines a maximum number of iterations for decoding a next symbol. This preferably employs a left most bit detect command. The invention considers the bit stream bit by bit until detection of a bit having a first digital state of the maximum number of iterations. If the maximum number of iterations occurs first, the invention decodes the considered bits. If a bit having the first digital state occurs first, the invention selects a number of next bits from the bit stream dependent upon the determined position within the coding table and decodes a symbol corresponding to the maximum number of bits and the selected number of next bits. The invention preferably pre-calculates an order symbol contexts corresponding to an order of determination of a code tree encompassing all possible codes and decodes symbols dependent upon a current context within the pre-calculated.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
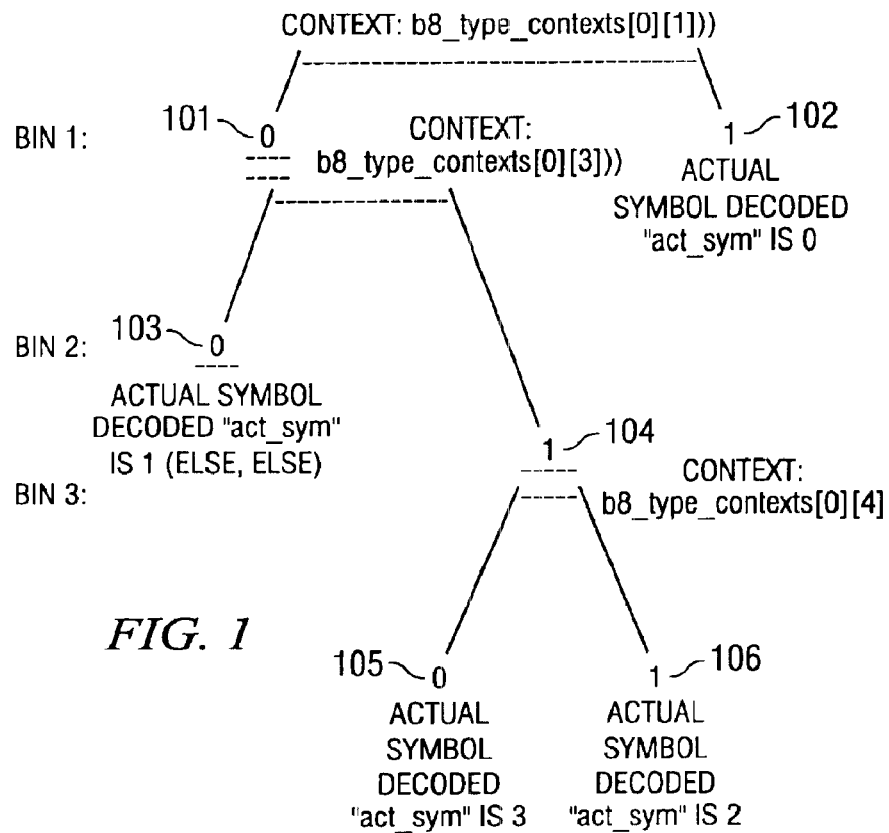
FIG. 1 illustrates an example code tree of the context based adaptive binary arithmetic decoding.

This invention pertains to optimized decoding of a context based adaptive arithmetic coding bit stream. The goal of this invention is to enable use of greater parallelism in decoding than previously possible to better use the resources of a very long instruction word (VLIW) digital signal processor (DSP) in decoding.

Consider this example prior art code for H.264 CABAC decoding of Listing 1:

```
/***************************************************
 * Macros
 ***************************************************/
#define get_byte( ) { \
            Dbuffer = Dcodestrm[(*Dcodestrm_len)++]; \
            Dbits_to_go = 7; \
            }
/*!
 ***************************************************
 * \brief
 *    biari_decode_symbol ( ) :
 * \return
 *    the decoded symbol
 ***************************************************
 */
unsigned int biari_decode_symbol(DecodingEnvironmentPtr dep,
    BiContextTypePtr bi_ct )
{
  register unsigned int bit = bi_ct->MPS;
  register unsigned int value = dep->Dvalue;
  register unsigned int range = dep->Drange;
  register unsigned int rLPS = rLPS_table_64x4 [bi_ct-
     >state] [(range>>6) & 0x03];
range -= rLPS;
  if (value < range)   /* MPS */
  bi_ct->state = AC_next_state_MPS_64[bi_ct->state];
                  // next state
  else                 /* LPS */
  {
    value -= range;
    range = rLPS;
    bit = !bit;
    if (!bi_ct->state) // switch meaning of MPS if
         necessary
      bi_ct->MPS ^= 0x01;
      bi_ct->state = AC_next_state_LPS_64[bi_ct->state];
                  // next state
    }
    while (range < QUARTER)
    {
      /* Double range */
      range <<= 1;
      if (--Dbits_to_go < 0)
         get_byte( );
    /* Shift in next bit and add to value */
        value = (value << 1) |((Dbuffer >> Dbits_to_go) &
            0x01);
    }
    dep->Drange = range;
    dep->Dvalue = value;
    return(bit);
  }
```

Listing 1

The function biari_decode_symbol accepts an arithmetically encoded buffer context "ctx." This function operates as part of the decoding decision and returns one bit either a '0' or '1'. The first part of the biari_decode_symbol checks to see whether the decoded symbol should be interpreted as a Most Probable Symbol (MPS) or as a Least Probable Symbol (LPS). The function checks if value extracted from the arithmetic buffer is larger than the variable range. If value smaller than range, this is interpreted as a MPS. If value is less than or equal to range, the symbol is decoded as LPS and range is deducted from value. The function returns the result via the variable bit. The second part of biari_decode_symbol performs the re-normalization of range. This re-normalization tracks re-normalization during encoding which keeps the low and high values of the arithmetic encoder from getting too close. If these become too close the encoded data may be incorrectly decoded. The encoder re-normalizes range to keep it above QUARTER (0.25).

The operations required to determine what was coded LPS or MPS are not the cycle intensive portions of the function. Using a Texas Instruments TMS320C6400 digital signal processor these operations require only about 10 cycles. However, the value of the symbol decoded depends on the current bit decoded. The entire biari_decode_symbol can be implemented on a TMS320C6400 in 24 cycles, ignoring cycles for function call overhead. The additional 14 cycles are a re-normalization loop.

Consider this example for decoding a field mode in H.264 as follows of Listing 2:

```
void readFieldModeInfoFromBuffer_CABAC( SyntaxElement *se,
        struct inp_par *inp,
        struct img_par *img,
        DecodingEnvironmentPtr dep_dp)
{
  int a,b,act_ctx;
  MotionInfoContexts *ctx = (img->currentSlice)->mot_ctx;
  Macroblock    *currMB = &img->mb_data[img->map_mb_nr];
    //GB current_mb_nr];
  if (currMB->field_available[0] == NULL) b = 0;
  else b = currMB->field_available[0]->mb_field;
  if (currMB->field_available[1] == NULL) a = 0;
  else a = currMB->field_available[1]->mb_field;
  act_ctx = a + b;
  se->value1 = biari_decode_symbol (dep_dp, &ctx->
    mb_aff_contexts[act_ctx]);
}
```

Listing 2

In this case the syntax element is decoded in one call to biari_decode_symbol because this syntax element has only two possible values '0' or '1'. This is the simplest case. Most syntax elements require multiple function calls to biari_decode_symbol function.

Consider on the other hand, this example of decoding the 8×8 block mode used in the H.264 standard. The H.264 video conferencing standard adapts the block sizes based on the image data. Several calls to the biari_decode_symbol are required based on the result of the decoding. Every call to the function requires at least 34 cycles, 24 core cycles and 10 cycles overhead. Decoding a symbol of "11", which requires five function calls, takes 170 cycles.

```
/*!
 ****************************************************************
 * \brief
 *    This function is used to arithmetically decode the 8x8
 *    block type.
 ****************************************************************
 */
void readB8_typeInfoFromBuffer_CABAC (SyntaxElement *se,
        struct inp_par *inp,
        struct img_par *img,
        DecodingEnvironmentPtr dep_dp)
{
  int act_sym = 0;
  int bframe = (img->type==B_SLICE);
  MotionInfoContexts *ctx = (img->currentSlice)->mot_ctx;
  if (!bframe)
  {
    if (biari_decode_symbol (dep_dp, &ctx->
      b8_type_contexts[0][1]))
    {
      act_sym = 0;
    }
    else
    {
      if (biari_decode_symbol (dep_dp, &ctx->
        b8_type_contexts[0][3]))
      {
        if (biari_decode_symbol (dep_dp, &ctx->
          b8_type_contexts[0][4]))
          act_sym = 2;
        else  act_sym = 3;
      }
      else
      {
        act_sym = 1;
      }
    }
  }
  else
  {
    if (biari_decode_symbol (dep_dp, &ctx->
      b8_type_contexts[1][0]))
    {
      if (biari_decode_symbol (dep_dp, &ctx->
        b8_type_contexts[1][1]))
      {
        if (biari_decode_symbol (dep_dp, &ctx->
          b8_type_contexts[1][2]))
        {
          if (biari_decode_symbol (dep_dp,
            &ctx->b8_type_contexts[1][3]))
          {
            act_sym = 10;
            if (biari_decode_symbol
              (dep_dp, &ctx->
              b8_type_contexts[1][3]))
              act_sym++;
          }
          else
          {
            act_sym = 6;
            if (biari_decode_symbol
              (dep_dp, &ctx->
              b8_type_contexts[1][3]))
              act_sym+=2;
            if (biari_decode_symbol
              (dep_dp, &ctx->
              b8_type_contexts[1][3]))
              act_sym++;
          }
        }
        else
        {
          act_sym=2;
          if (biari_decode_symbol (dep_dp,
            &ctx->b8_type_contexts[1][3]))
            act_sym+=2;
          if (biari_decode_symbol (dep_dp,
            &ctx->b8_type_contexts[1][3]))
            act_sym+=1;
        }
      }
      else
      {
        if (biari_decode_symbol (dep_dp, &ctx-
          >b8_type_contexts[1][3])) act_sym =
          1;
        else  act_sym = 0;
      }
      act_sym++;
    }
    else
    {
      act_sym= 0;
    }
  }
  se->value1 = act_sym;
}
```

Listing 3

This process causes a computational problem. Repeated calls to biari_decode_symbol to extract a single bit of the current symbol for decoding is slow. In particular, this organization of the solution prevents effective use of the parallel processing available in a VLIW DSP. This invention employs two features to attack this problem.

The first of these features involves the re-normalization of range. The prior art example listed above employs a loop while (range <QUARTER) for this normalization. Range is doubled by left shifting for every iteration of this while loop. In addition, a bit from the data buffer is extracted in each iteration of the while loop. In this invention, the number of iterations of binari_decode_symbol is calculated using a left most bit detect command as follows:

num_iters=lmbd(1, range)−lmbd(1, QUARTER)

where: lmbd is the leftmost bit detect for 1 or 0 depending on the first parameter. Thus the number of iterations (num_iters) is the left most 1 of the range (lmbd(1, range)) minus the left most 1 of QUARTER (lmbd(1, QUARTER)). The original prior art code doubled range every iteration where range was less than QUARTER. The above function determines the number of doubling of range required before range is greater than QUARTER based upon their respective most significant bits (left most 1 bit). Since QUARTER is a fixed constant depending on the number system selected, lmbd(1, QUARTER) can be pre-computed. For example in a Q10 number system, 1 would be represented as 1024 and QUARTER as 256. Placing "256"in a 32-bit word (0000 0000 0000 0000 0000 0000 1000 0000) results in a left most one of 25. Subtracting the left most one of QUARTER from the left most one of range yields the number of doublings of range required before range exceeds QUARTER.

This determination of num_iters enables a deterministic solution of the number of new bits to extract from the data stream. The prior code extracted one bit each iteration of the while loop. With knowledge of how many iterations num_iters in the re-normalization loop, it is immediately known to extract a bit field of length num_iters bits from the arithmetically encoded buffer. Thus the following linear code can be substituted for the loop extracting one bit at a time of the prior art:

```
num_iters = lmbd(1, range) − lmbd(1, QUARTER).
if (num_iters > 0)
    value = (value << num_iters) | (variable bit field
    of length num_iters from arithmetically
    encoded buffer);
```

Listing 4

Replacing a while loop with deterministic code improves processor performance when using pipelined or super-pipelined processors. This new code eliminated conditional branch instructions which are not well handled in pipelined processors. The process works in the decoder because the problem is to determine the number of bits to extract from the bit stream based on num_iters.

This change in the re-normalization algorithm permits biari_decode_symbol to be optimized for a super-pipelined implementation of the biari_decode_symbol. This may be achieved by performing multiple biari_decode_symbol operations in parallel, as close to each other as possible. The following explanation describes when super-pipelining is inappropriate and when it may be applied.

There are various syntax-elements that must be decoded as part of video decoding in H.264. Two of the syntax elements are shown in the examples above in Listings 2 and 3. In the field mode decoding (Listing 2) the result is a 1-bit syntax element. In decoding this 1-bit syntax element, the decoder examines the "A"and "B"neighbors. The context is used to determined as act_ctx=a+b. The actual decode is performed using this context act_ctx. Each individual bit that needs to be decoded needs a context, which includes information of the state and the most probable symbol (MPS). Since the syntax element has only one bit, there is exactly one call to biari_decode_symbol for each symbol decode. After employing the deterministic re-normalization shown above (Listing 4), this process cannot be made any faster by instruction or task parallelism.

A more typical example of a syntax element decode is radically different from the previous example of decoding a field mode. This includes two major inter-related differences. First, the syntax element to be decoded may have multiple bits. If the syntax element has anywhere from 1 bit to K bits, it includes a variable bit-field which could have up to a maximum length of K. Second, each bit needs a function call to biari_decode_symbol with a corresponding context. On decoding multiple bits, different contexts are required to decode individual bits. The way in which we traverse through the contexts depends on the syntax element and the decisions of the individual decoded bits.

FIG. 1 illustrates an example code tree that shows how the super-pipelining is possible. FIG. 1 illustrates end nodes 102, 103, 15 and 106 and intermediate nodes 101 and 104. This example corresponds to the decoding which is not B type in Listing 3 readB8_typeInfoFromBuffer_CABAC. A similar code tree (though different in structure) can be drawn for the B frame case. This function decodes a 8×8 block type. This function operates on two different types of decision trees depending on whether the frame being decoded is a P frame or a B frame. An initial sort is made by the If statement "if(!bframe)." A true response indicates a P frame. A false response indicates a B frame. This invention may require two forms of the super-pipelined biari_decode_symbol function for decoding the two different cases.

Consider the first decision tree, where the if(!bframe) function is true indicating a P frame. FIG. 1 illustrates the decision tree. The conventional method (Listing 3) calls the biari_decode_symbol function several times to examining what happened in the decoding decision at each bin "i." Each call of the function determines whether the actual symbol has been completely decoded or some more bits need to be decoded. This determination depends on the particular decision tree and the particular syntax element. In this example the decoded symbol may have from one to three bits. Table 1 shows the range of possibilities.

TABLE 1

| Bit Pattern | Symbol Value | Context (s) |
|---|---|---|
| 1 | 0 | b8_type_contexts [0] [1] |
| 00 | 1 | b8_type_contexts [0] [1], b8_type_contexts [0] [3] |
| 011 | 2 | b8_type_contexts [0] [1], b8_type_contexts [0] [3], b8_type_contexts [0] [4] |
| 010 | 3 | b8_type_contexts [0] [1], b8_type_contexts [0] [3], b8_type_contexts [0] [4] |

This invention is a method that permits multiple binary decodes even if the decision tree keeps changing even within a syntax element (as between P frames and B frames in this example) and across multiple syntax elements.

The binary tree shown in FIG. 1 and Table 1 is skewed because all branches are not fully populated. For example, the node 102 with a bit pattern "1"at bin 1 has no children. Thus while '1'is a valid code in isolation, '100', '101', '110', '111', '10', '11' are illegal codes. This invention is a two step process for parsing skewed binary trees. These trees are skewed for the reason mentioned above. They are "binary" because at each bin only two outcomes '0' or '1' are possible. Upon decoding a bin, the decoder calls biari_decode_symbol which returns either a "MPS"or "LPS".

Figure 2:
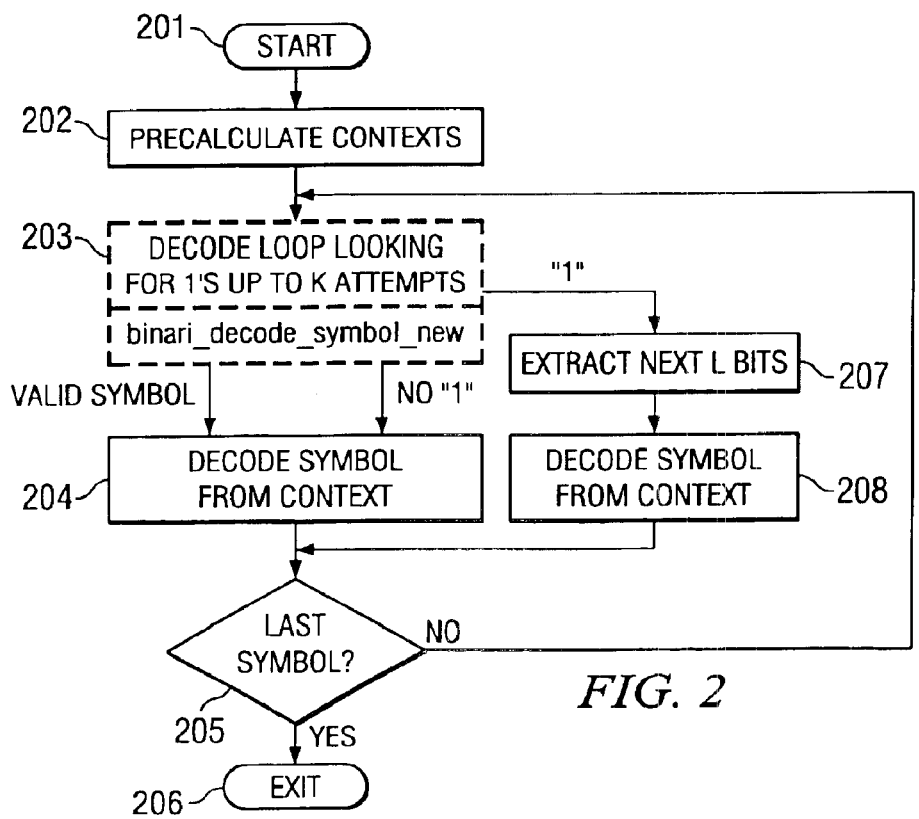
FIG. 2 illustrates the process of decoding according to this invention.

FIG. 2 illustrates the two step process of this invention. Following the start (processing block 201), the process pre-calculates the decode contexts (processing block 202). The decoder pre-computes the order of the contexts to be used, such as b8_type_contexts[0] [1] and b8_type_contexts[0] [3] and stores their addresses in an "context_address_traversal"array. These pre-stored contexts are used in the decode. The process performs K number of iterations searching for a "1" bit (processing block 203). The number K is determined by inspection of the code tree and depends upon the structure of the particular code tree. Note particularly that each code tree encountered will need such an inspection and determination of K. Each loop includes the function binari_decode_symbol_new. The function binari_decode_symbol_new is the same as the function bnari_decode_symbol of listing 1 except for the substitution of the deterministic calculation of num_iters of Listing 4 based upon the left most bit detect instruction for the renormalization loop at the end of the old function. The decoder continues decoding via binari_decode_symbol_new while a '1' is not seen up to a maximum of K attempts. For the example code tree of FIG. 1, K is 2. Thus for code tree of FIG. 1, the decoder looks for a '1' up to a maximum of two attempts. For this example, in one pass the decoder will see either '1', '01', or '00'.

This method remembers when it encountered a '1' and if so where. Thus this loop which searches for a '1' can iterate once or twice in this example. By writing multiple biari_decode_symbol_new functions in parallel, software pipelining cuts the performance down from 39 cycles/bin for an isolated biari_decode_symbol function to a pipelined implementation of 13n+26 to give a performance of 39 cycles for the first bin, where n is the number of 1's encountered, and 52 cycles for 2 bins on the Texas Instruments TMS320C6000 architecture. The isolated biari_decode_symbol would take 39 cycles for first bin and 78 cycles for the second bin. Super-pipelining is possible because knowing the order in which the contexts need to be traversed permits a read ahead of the contexts using an independent set of read pointers and update of the contexts with an independent set of write pointers. These read and write pipelines no longer need to be synchronized with each other. This decoupling helps overcome the long latencies associated with load instructions on deeply pipelined processors.

There are several exits from processing block 203. Processing block 203 could reach the end of a code tree branch before K iterations without encountering a "1" (Valid Symbol at processing block 230). This would result in finding a valid symbol. Processing block 203 could complete K iterations without detecting a 1 (No "1" at processing block 203). This would happen in the current example if the bit pattern were "00." In either the case, then processing block 204 decodes the bit pattern based upon the current context (processing block 204). The process tests to determine if this is the last symbol in the current group (decision block 205). If this is not the last symbol (No at decision block 205), the process loops back to processing block 203 to operate to determine the next symbol. If this is the last symbol (Yes at decision block 205), then the process ends (exit block 206).

The final exit from processing block 203 occurs upon detection of a "1" in the bit stream ("1" at processing block 203) following less than or equal to K attempts. In this example, this is invoked only if a '1' is detected within two further iterations but not on the first iteration. In this case, the process extracts L remaining bits (processing block 207). The exact number L for any particular exit depends upon the structure of the code tree and the particular point of exit from processing block 203. This will generally differ for each code tree and each position within the code tree when the "1"is detected. Thus the process must be aware of the position within the code tree at this point, that is, the place where this first '1' appears. For this example, if the process detects a '1' after two iterations it calls processing block 207 to extract one more bit because at this position within the code tree only one more bit is necessary to compete the symbol. This will explicitly tell us if the decode symbol is 010 or 011. This data is then decoded based upon the current context (processing block 208). Process flow advances to decision block 205 to detect whether the process is complete. Note that processing block 203 sought 1's in accordance with this example. Depending upon the skew of the code tree, seeking 0's may be better.

Using these two branches (processing blocks 203 and 204 and processing blocks 207 and 208) any skewed binary code tree structure can be parsed efficiently by separate super-pipelined stages. Most syntax elements to be decoded will have a skewed binary code tree. There is more performance gain from super-pipelining for more skewed the code trees. If the binary tree has N levels with a valid code word of N bins, then the gain by using super-pipelining is approximately (39−13) (N−1), where N is the maximum number of attempts of the first step looking for a terminating '1' or '0' depending on the code tree. For the code tree example of FIG. 1, there is a terminating 1 in the first step. However, some code trees can have a terminating 0.

In a similar manner, code trees for other syntax elements can be factored into a two branch process. This approach is unique in that it takes the structure of the code tree into effect at the time the parameters K and L and terminating 0 or 1 are decided instead of interpreting the decision tree at every level. The process is akin to compiling the decode process rather than interpreting the decode process. This invention takes into account the structure of the code tree in designing this compiled decode function rather than checking every branch of the code tree during decode.

The combination of removal of the re-normalization loop and the recognition that multiple biari_decode_symbol_new functions can be performed in parallel lead to a super-pipelined structure that provides better performance on a VLIW architecture with multiple execution units. Breaking the prior art single bit step decoding into a two step process enables better performance. Each separate step can be super-pipelined to speed up both individually, while the skewed nature of the binary tree prevents super-pipelining of the combined function. Breaking the decoding into a two step process transforms an irregular ill-defined problem into two sets of regular well defined problems to which super-pipelined pipelining can be applied. Determination of the number of iterations performed by the prior art solution using the left most bit detect command permits much faster implementations of the biari_decode_symbol_new function than can be achieved by attacking the whole problem.

This technique enables use of the power of software pipelining on the biari_decode_symbol_new. Thus the number of cycles required to perform multiple iterations goes down, in steady state to 14 cycles/bit with a minimum of two iterations required. Thus any symbol can be decoded in 14*max_iters+14*K cycles. In the case of the symbol "11", instead of taking 170 cycles as in the prior art, the modified method where max_iters=4 and K=1 takes 14*1+14*1+20 overhead cycles (pipe up/down) or 90 cycles. This is a speed up of nearly two times the prior art.

This technique turns out to be more beneficial for longer trees. In general, any binary tree can then be parsed by a combination of the two loops. This technique works better on skewed binary trees which are heavily weighted in one direction. At the rate of 14 cycles/bin, the modified algorithm allows the complexity of CABAC decoding to approach, 14*#bits decoded. Based on empirical data for a 1 MBps input stream, this could be from 1.5 to 3 MBps of output bit rate, for the various syntax elements using 50 MHz on a digital signal processor. At higher bit-rates a hardware approach may be required for this problem.

This invention is unique in the following ways. This invention increases the available instruction level parallelism (IPC) by performing a highly serial task in a more amenable fashion for very long instruction word (VLIW) digital signal processors. This invention makes all software implementations of CABAC based decoding from five to eight times faster on digital signal processors. Typically the second pass that gets an additional pattern, gets a 2 to 3 bit pattern, to narrow the exact symbol, then based on table lookup. This invention uses software pipelining and intelligent algorithm design to narrow down CABAC decoding. In the prior art CABAC decoding was inherently serial. This invention converts this to a parallel two to three pass algorithm per syntax element.

This invention is advantageous because it provides the ability to implement H.264 based CABAC decoding efficiently on a VLIW digital signal processor for imaging/video without hardware assistance. This invention is applicable to digital still cameras and digital signal processor platforms focused on implementing video standards.

What is claimed is:

1. A method of decoding a context based adaptive binary arithmetic encoded bit stream comprising the steps of:
   determining a maximum number of iterations for decoding a next symbol dependent upon a code tree corresponding to the encoded bit stream;
   considering the bit stream bit by bit until detection of a bit having a first digital state of the maximum number of iterations;
   if the maximum number of iterations occurs before detecting a bit having the first digital state, decoding the considered bits;
   if a bit having the first digital state is detected before the maximum number of iterations, selecting a number of next bits from the bit stream dependent upon the determined position within the code tree; and
   decoding a symbol corresponding to the determined position within the code tree and the selected number of next bits.

2. The method of claim 1, wherein:
   said step of considering the bit stream bit by bit for a maximum number of iterations for decoding a next symbol includes for each iteration
   determining a left most one bit position of QUARTER,
   determining a left most one bit position of a range,
   determining the number of iterations by subtracting the left most one bit position of QUARTER from the left most one bit position of range.

3. The method of claim 1, further comprising:
   pre-calculating an order symbol contexts corresponding to an order of determination of a code tree encompassing all possible codes; and
   each step of decoding a symbol decodes the symbol dependent upon a current context within the pre-calculated order of symbol contexts.

* * * * *